United States Patent
Frielingsdorf

[19]
[11] Patent Number: 6,028,430
[45] Date of Patent: Feb. 22, 2000

[54] METHOD FOR MONITORING A CAPACITOR BUSHING, AND MONITORING SYSTEM

[75] Inventor: Helmut Frielingsdorf, Bergisch-Gladbach, Germany

[73] Assignee: HSP Hochspannungsgeraete Porz GmbH, Cologne, Germany

[21] Appl. No.: 08/976,732

[22] Filed: Nov. 24, 1997

Related U.S. Application Data

[63] Continuation of application No. PCT/DE96/00901, May 23, 1996.

[30] Foreign Application Priority Data

May 24, 1995 [DE] Germany ............... 195 19 230

[51] Int. Cl.[7] ............................................. G01R 27/26
[52] U.S. Cl. ............................................. 324/519; 324/536
[58] Field of Search ................................. 324/535, 519, 324/551, 536, 532; 327/72

[56] References Cited

U.S. PATENT DOCUMENTS

| | | |
|---|---|---|
| 3,810,027 | 5/1974 | Cook ................................ 328/129 |
| 3,882,378 | 5/1975 | Foord . |
| 4,305,071 | 12/1981 | Bell ................................... 340/712 |
| 4,346,340 | 8/1982 | Hackett-Jones ................... 323/249 |
| 4,757,263 | 7/1988 | Cummings, III . |
| 5,371,458 | 12/1994 | Heikkila ........................... 324/772 |
| 5,682,100 | 10/1997 | Rossi ................................. 324/536 |
| 5,839,092 | 11/1998 | Erger ................................. 324/536 |

FOREIGN PATENT DOCUMENTS 36 01 934 A1   7/1987   Germany .

*Primary Examiner*—Maura Regan
*Attorney, Agent, or Firm*—Herbert L. Lerner; Laurence A. Greenberg; Werner H. Stemer

[57] ABSTRACT

A capacitor bushing with a tap for a reduced voltage between its capacitor inserts is monitored with the method. The reduced voltage is supplied to a detection device that monitors the reduced voltage for any change. A change and its time interval from a further change are determined, and an error signal corresponding to the frequency of the change in the reduced voltage is generated. The method may be performed with the disclosed monitoring system.

18 Claims, 1 Drawing Sheet

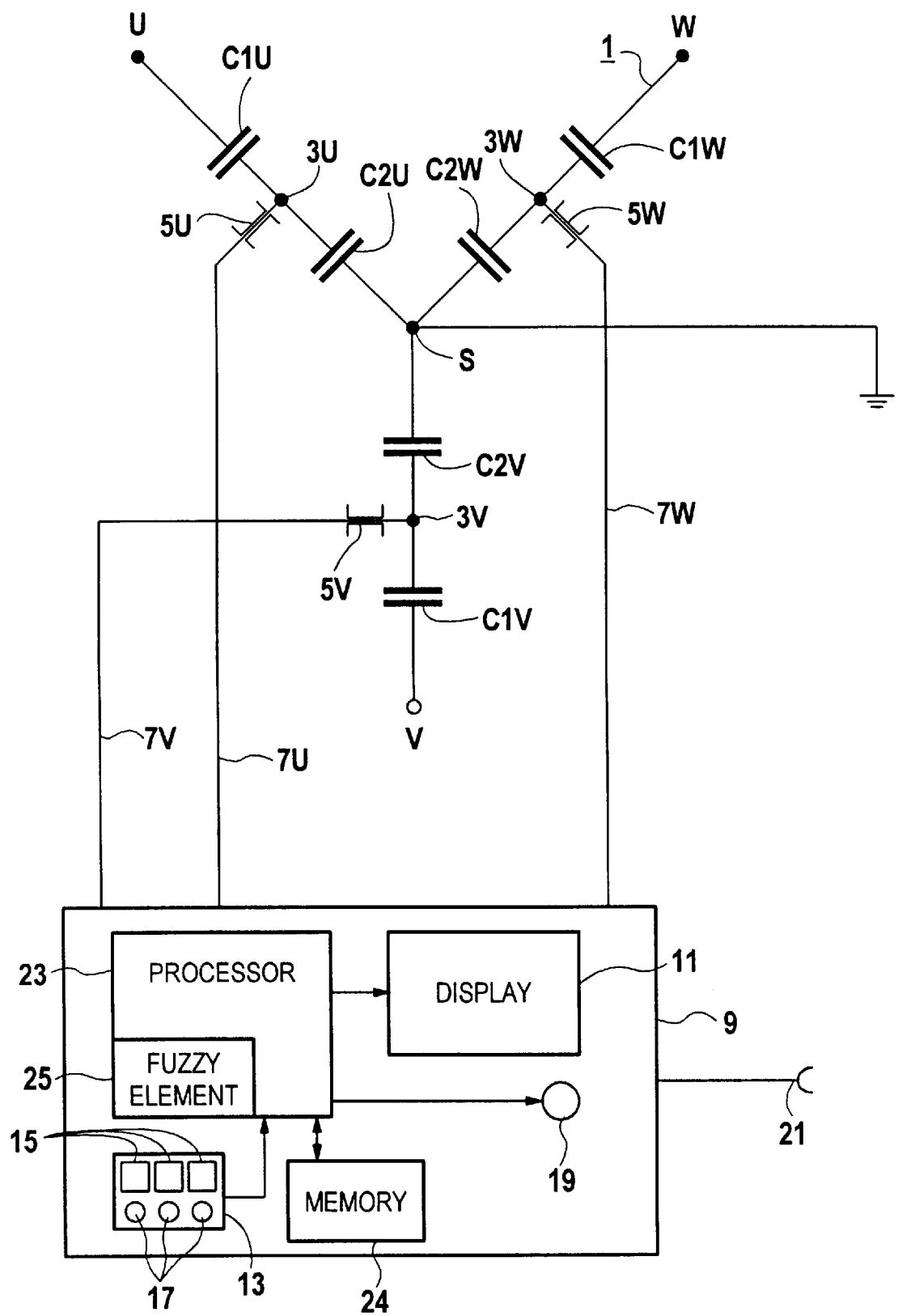

METHOD FOR MONITORING A CAPACITOR BUSHING, AND MONITORING SYSTEM

CROSS-REFERENCE TO RELATED APPLICATION

This is a continuation of international application PCT/DE96/00901, filed May 23, 1996 which designated the United States.

BACKGROUND OF THE INVENTION

Field of the Invention

The invention pertains to a monitoring process for a capacitor bushing with capacitor inserts condenser-Bushing in accordance with IEC137 or IEEE C57, and to a monitoring configuration performing the process.

A permanently monitored capacitor bushing configuration (also referred to as a capacitor lead-through) for large transtormers in three-phase systems has become known heretofore from German patent disclosure DE 36 01 934 A1. There, for each phase in a polyphase capacitor bushing, one tap between the capacitor inserts is provided, so that a reduced voltage can be picked up. The reduced voltages are then delivered to a bridge circuit, to which a measuring instrument is connected. In the event of an error, especially a short circuit between individual capacitor inserts, in one of the phases of the capacitor bushing, an error voltage is detected by the measuring instrument, and an error signal is generated. This kind of monitoring is suitable for detecting coarse errors within a polyphase capacitor bushing. Small errors, however, which might not at first impair operating performance, cannot be detected with that configuration.

SUMMARY OF THE INVENTION

It is accordingly an object of the invention to provide a method for monitoring a capacitor bushing and a monitoring system operating according to the novel method, which overcomes the above-mentioned disadvantages of the heretofore-known devices and methods of this general type and which allows the detection of even small errors. It is therefore the primary object to disclose a method and a suitable configuration for that purpose.

With the foregoing and other objects in view there is provided, in accordance with the invention, a method for monitoring a capacitor bushing with a reduced voltage tap between capacitor inserts thereof. The novel method comprises the following steps:

supplying a reduced voltage from a reduced voltage tap to a detection device, and monitoring the reduced voltage for any change with the detection device;

storing a change in the reduced voltage and related time information in memory;

determining a time interval between at least two changes in the reduced voltage; and generating an error signal corresponding to a frequency of changes in the reduced voltage.

Depending on the importance of the error, therefore, a suitable warning can be issued to the operators to perform electric monitoring. Specifically, a merely partial disruptive discharge between two capacitor inserts should not impair operation. The mere fact that a disruptive discharge has occurred may already be of interest to the operators, however. A simple report may therefore be issued, for example. Signaling of a malfunction or a warning signal is then given in a staggered fashion. The error signal thus includes both a quantitative and a qualitative aspect. Although the various changes may possibly be identical, signaling can still be done differently. The method can be employed in lead-throughs with an arbitrary number of phases, and in particular one to three phases.

In accordance with an added feature of the invention, the change in the reduced voltage is stored in memory after a predetermined limit value or threshold value is exceeded. As a result, only slight interference voltages, for instance, that do not attain a predetermined level, will not be assessed.

In accordance with an additional feature of the invention, the changes stored in memory may be assessed with a predetermined weighted assessment prior to the generating step. The error signal is then generated after the weighting of the memorized changes with the aid of the fuzzy element. In this way, fast detection of critical or atypical error situations is also possible.

In accordance with another feature of the invention, the time information stored in memory may be defined as an instant in time designating a beginning of the respective change. Alternatively, or in addition, the differential time between two changes can be stored in memory as the time information. In each case, accurate detection of the frequency of changes is possible.

The reduced voltage is preferably monitored for each phase of the capacitor bushing. Thus the entire monitoring system can be a single phase or multi-phase system, which meets the need for selective error detection.

It is further possible to compare a chronological image of the detected frequency of the changes with a memorized model image of a predetermined error condition, and the error signal can be generated if there is at least partial agreement between the two images. As a result, even specialized error, which are difficult to detect, can be detected reliably. The images can be stored in memories of the detection device.

With the above and other objects in view there is also provided, in accordance with the invention, a monitoring system for a capacitor bushing with capacitor inserts and a reduced voltage tap between the capacitor inserts, comprising:

a detection device connected to and receiving a reduced voltage signal from a reduced voltage tap, the detection device monitoring the reduced voltage signal for changes in the reduced voltage;

the detection device including a memory for storing any changes in the reduced voltage and related time information;

a computation element connected to the memory for determining a time interval between at least two changes; and the detection device generating an error signal proportional to a frequency of changes in the reduced voltage.

Such a monitoring configuration enables secure, reliable monitoring, and identical changes in the reduced voltage are assessed differently depending on their behavior over time.

The detection device preferably has means for optical and/or electrical outputting of the error signal. These means may for example be an interface or a display. In this way, an error can be brought to the attention of the operator in whatever is the most favorable way.

Advantageously, a limit value element is provided, and the the change in the reduced voltage is stored in memory after a predetermined limit value (threshold value) is exceeded. This makes a coarse selection among the detected changes possible.

In accordance with a further feature of the invention, the monitoring system comprises a fuzzy element for weighting the reduced voltage changes, and the error signal is generated after weighting with the fuzzy element. This makes especially fast, reliable error detection possible.

The detection device is advantageously a multi-phase (polyphase or m-phase) system, and in particular a three-phase configuration. This provides for selective error detection.

The detection device, in particular the computation element, can be embodied as an analog or digital circuit, for instance with a processor. For digital measured value processing, A/D converters or digital signal processors can optionally also be used.

With the above and other objects in view there is also provide, in accordance with an alternative of the invention, a monitoring method for a capacitor bushing with capacitor inserts and a reduced voltage tap between the capacitor inserts, which comprises: supplying a voltage signal from a reduced voltage tap to a detection device and monitoring the voltage signal for any change, counting changes in the voltage signal, and, after a predetermined number of changes have been counted, generating an error signal.

In accordance with again another feature of the invention, the generating step comprises generating the error signal only if the predetermined number of changes occur within a predetermined period of time.

In accordance with again an additional feature of the invention, the counting step comprises counting only those changes in the reduced voltage whose voltage signal exceeds a predetermined limit value for the reduced voltage.

These alternative embodiments are especially simple and can optionally be added to existing equipment by retrofitting. Where the error signal is not generated until the changes occur within a predetermined period of time, the signaling is based on information about the frequency of the changes. Where the count of changes is required to exceed a predetermined limit value, disruptions from interference voltages are safely precluded.

Finally, there is provided a monitoring system for a capacitor bushing with capacitor inserts and a reduced voltage tap between the capacitor inserts, comprising:

a detection device for monitoring a reduced voltage at the reduced voltage tap for any change;

a counting device for counting changes in the reduced voltage; and an error signal generator generating an error signal after a predetermined number of changes is exceeded.

This configuration is very simple in design and can be attained at little effort and expense.

Other features which are considered as characteristic for the invention are set forth in the appended claims.

Although the invention is illustrated and described herein as embodied in method for monitoring a capacitor bushing, and monitoring configuration for the purpose, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The drawing FIGURE is a substitute circuit diagram of a three-phase capacitor bushing (lead-through) and an associated monitoring system.

DESCRIPTION OF THE PREFERRED EMBODIMENTS

Referring now to the FIGURE of the drawing in detail, the ensuing remarks relate, as an example for the overall function, only to one phase, namely phase W, of the capacitor bushing 1. It will be appreciated that all of the pertinent details and remarks logically apply also to the other phases, as well as to systems with any number of phases.

The capacitor bushing 1 is a three-phase (three-phase) system purely by way of example. Other numbers of phases, such as a single-phase version, are possible. Naturally one separate lead-through per phase, which together electrically produce a three-phase configuration, may be provided mechanically.

Capacitor bushings to which the invention pertains are used for instance at high voltages, which can be in the range from only a few kilovolts to several thousand kilovolts. A specialized version is the transformer lead-through, in which mastery of the high voltages is made possible within the least possible space. Other applications, for instance as a lead-through for building walls or for encapsulated housings, in particular $SF_6$ encapsulations, are also possible.

For field control the capacitor bushing 1 has caps in accordance with the prior art, and not shown in detail, in its interior; in electrical terms, they form a series circuit of capacitors. The star point S may be grounded, and the ground in this example acts as a common return line for the three phases.

Between specified capacitor inserts, a tap 3W is provided. Depending on the reduced voltage desired, the tap 3W is specified as a voltage divider. As a result, in the substitute electrical circuit diagram, a capacitive voltage divider is formed, with a first capacitor C1W and a second capacitor C2W. The tap 3W is connected to a detection device 9, either via a measurement lead-through 5W or through some other suitable electrical insulation by means of a measurement line 7W. The tap 3W furnishes a reduced voltage that corresponds to a copy of the high voltage located in the interior of the capacitor bushing 1—in this case corresponding to the connection point W.

This kind of capacitor bushing can contain from about 10 to several hundred capacitor inserts, for example. It can happen that an electrical sparkover between two inserts occurs, which represents a short circuit between the inserts. A single partial disruptive discharge, or only a few partial disruptive discharges, need not as a rule be any risk in operating the capacitor bushing 1. However, this damage mechanism as a rule proceeds like an avalanche. That is, the period of time between two disruptive discharges becomes shorter, the more frequent the disruptive discharges.

This is where the novel concept comes into play, as will be understood from the following description of the process: With the reduced voltage tapped, the detection device 9 detects any disruptive discharge events, which are expressed as a slight voltage jump, and stores these changes and pertinent time information in memory. The time information may be, in particular, the point in time when the event occurred. Either the magnitude of the voltage change, or merely one piece of information on the presence of the event can then be stored in memory selectively. As a rule, there is a direct relationship between the magnitude of the voltage jump and the number of short-circuited capacitor inserts, and in practice this relationship is known, or its proportion can be estimated.

With the aid of a computation element, such as a processor 23, the time interval between the various changes is ascertained in the detection device 9. The frequency with which the changes occur makes it possible to make a statement about the operational reliability of the capacitor bushing 1. The time interval can also be stored in a memory 24.

Depending on how dangerous the sparkovers or disruptive discharges are, and in particular depending on their frequency, a suitably weighted report or error signal is generated in the detection device 9 by some suitable device. In the initial stage, for instance—that is, the first time a disruptive discharge ever occurs in the capacitor bushing—this can take the form of a sparkover report, and in a middle stage it can be a warning report, and in a final stage, in which operating safety is threatened, it can take the form of a turnoff signal for the high-voltage operating means. The term frequency is understood here to mean the number of disruptive discharges per unit of time.

The staggering of the warning or malfunction signal can be oriented toward an empirically ascertained exponential function of the disruptive discharge frequency. In this way, in a simple malfunction situation, the applicable operating means need not be turned off yet. Optionally, operation can be maintained even over a relatively long period, optionally with slight limitations. This kind of monitoring is highly suitable from the standpoint of operational management, because a shutoff is not necessary immediately.

The measurement accuracy of the detection device 9 must be so accurate that a sparkover between two inserts can be detected. In a capacitor bushing with 100 equal inserts, for example, the first partial disruptive discharge would amount to a voltage change of only 1%, referred to the total voltage. Optionally the detection device 9 must therefore also have additional means that make it possible to distinguish between sparkovers and other voltage elevations, so as to avert errors in the monitoring. For example, limit value processing with the aid of a limit value element may also be done.

In rare cases it can also happen that because of material defects, the damage mechanism does not obey an exponential function. In such a case, an avalanche-like frequency of disruptive discharges can either occur sooner, or can possibly be reduced by burnout of the location of the error.

In that case, the detection device 9 may also include a fuzzy element 25, which permits a weighted assessment or evaluation of the disruptive discharge frequency, so that even error situations not involving the exponential function can be detected reliably and can lead to appropriate signaling or even a shutoff. To that end, the information stored in memory about the changes in the reduced voltage are subjected to a weighted assessment, before an error signal is generated.

Optionally, data on the disruptive discharge frequency may also be stored permanently in the detection device 9, in the form of a copy or data copy with which the newly occurring disruptive discharges are compared, so as then to bring about suitable signaling.

For the sake of operational management, the detection device 9 may be provided or connected with a display 11, on which operating functions, malfunction reports and other information can be called up with the aid of a keyboard 13. The keyboard 13 may include keys 15 or adjusters 17, for instance. A malfunction may simply be signaled with an optical indication, such as with a malfunction display 19, to be provided in addition to the display 11.

The detection device 9 also has an output 21, which may be a simple malfunction signal output for carrying the malfunction signal onward, or as an interface for passing arbitrary information onward. The applicable signal or information can then be carried onward to higher-level control equipment for further processing.

An alternative embodiment provides that only the changes in the reduced voltage are counted, and the error signal is generated after a predetermined number of changes. This embodiment is especially simple and can optionally be installed in existing equipment by retrofitting. Then the error signal is not generated until the changes occur within a predetermined period of time. The signaling is then based on information about the frequency of the changes. Limit value processing of the change in the reduced voltage is possible. A configuration suitable for that purpose can be achieved at little effort or expense as described above.

It is essential in the above-described concept that a quasistatistical evaluation of the errors that occur is performed. The evaluation makes it possible to estimate the risk to operating safety that the error or errors represent. It is understood that the characteristics listed above can also be combined with one another in an arbitrary way, without departing from the presently disclosed concept.

I claim:

1. A method for monitoring a capacitor bushing with a reduced voltage tap between capacitor inserts thereof, the method which comprises:

supplying a reduced voltage from a reduced voltage tap to a detection device, and monitoring the reduced voltage for any change with the detection device;

storing a change in the reduced voltage and related time information in memory;

determining a time interval between at least two changes in the reduced voltage; and generating an error signal corresponding to a frequency of changes in the reduced voltage.

2. The monitoring method according claim 1, wherein the storing step comprises comparing the change in the reduced voltage with a predetermined threshold and storing the change in the memory only if the change exceeds the predetermined threshold.

3. The monitoring method according to claim 1, which comprises, prior to the generating step, assessing the changes stored in memory with a predetermined weighted assessment.

4. The monitoring method according to claim 1, wherein the time information stored in memory is an instant in time designating a beginning of the respective change.

5. The monitoring method according to claim 1, wherein the time information stored in memory is a time difference between two changes.

6. The monitoring method according to claim 1, wherein the time information stored in memory is an instant in time designating a beginning of the respective change and a time difference between two changes.

7. The monitoring method according to claim 1, wherein the capacitor bushing is a multi-phase lead-through with a plurality of phases, and the monitoring step is performed for each phase of the plurality of phases.

8. The monitoring method according to claim 1, which further comprises comparing a chronological image of the detected changes with a previously modeled image of a predetermined error condition, and wherein the error signal is generated in the generating step upon an at least partial agreement between the chronological image and the modeled image.

9. A monitoring system for a capacitor bushing with capacitor inserts and a reduced voltage tap between the capacitor inserts, comprising:

a detection device connected to and receiving a reduced voltage signal from a reduced voltage tap, said detection device monitoring the reduced voltage signal for changes in the reduced voltage;

said detection device including a memory for storing any changes in the reduced voltage and related time information;

a computation element connected to said memory for determining a time interval between at least two changes; and said detection device generating an error signal proportional to a frequency of changes in the reduced voltage.

10. The monitoring system according to claim 9, which further comprises a limit value element, and wherein a change in the reduced voltage is stored in memory only after a predetermined limit value is exceeded.

11. The monitoring system according to claim 9, which further comprises a fuzzy element for weighting the reduced voltage changes, and wherein the error signal is generated after weighting with the fuzzy element.

12. The monitoring system according to claim 9, wherein the detection device is a single phase detection device.

13. The monitoring system according to claim 9, wherein the detection device is a multi-phase detection device.

14. The monitoring system according to claim 13, wherein the detection device is a three-phase detection device.

15. A monitoring method for a capacitor bushing with capacitor inserts and a reduced voltage tap between the capacitor inserts, which comprises: supplying a voltage signal from a reduced voltage tap to a detection device and monitoring the voltage signal for any change, counting changes in the voltage signal, and, after a predetermined number of changes have been counted, generating an error signal.

16. The monitoring method of claim 15, wherein the generating step comprises generating the error signal only if the predetermined number of changes occur within a predetermined period of time.

17. The monitoring method according to claim 15, wherein the counting step comprises counting only those changes in the reduced voltage whose voltage signal exceeds a predetermined limit value for the reduced voltage.

18. A monitoring system for a capacitor bushing with capacitor inserts and a reduced voltage tap between the capacitor inserts, comprising:

a detection device for monitoring a reduced voltage at the reduced voltage tap for any change;

a counting device for counting changes in the reduced voltage; and an error signal generator generating an error signal after a predetermined number of changes is exceeded.

* * * * *